(12) United States Patent
Schleyen et al.

(10) Patent No.: US 10,340,116 B1
(45) Date of Patent: Jul. 2, 2019

(54) IMAGING AN AREA THAT INCLUDES AN UPPER SURFACE AND A HOLE

(71) Applicant: APPLIED MATERIALS ISRAEL LTD., Rehovot (IL)

(72) Inventors: Ran Schleyen, Rehovot (IL); Vladislav Kaplan, Raanana (IL); Shachar Paz, Modi'in (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/007,580

(22) Filed: Jun. 13, 2018

(51) Int. Cl.
*H01J 37/22* (2006.01)
*G06T 7/00* (2017.01)
*G06T 5/00* (2006.01)
*G06T 5/50* (2006.01)

(52) U.S. Cl.
CPC ............ *H01J 37/222* (2013.01); *G06T 5/002* (2013.01); *G06T 7/001* (2013.01); *G06T 5/50* (2013.01); *G06T 2207/20221* (2013.01); *G06T 2207/30148* (2013.01); *H01J 2237/221* (2013.01); *H01J 2237/2448* (2013.01); *H01J 2237/24475* (2013.01); *H01J 2237/24495* (2013.01)

(58) Field of Classification Search
CPC . H01J 37/222; H01J 2237/2448; G06T 5/002; G06T 7/001; G06T 5/50
USPC .......................................................... 348/86
See application file for complete search history.

(56) References Cited

U.S. PATENT DOCUMENTS

2017/0322021 A1\* 11/2017 Takagi ................... G01B 15/04

\* cited by examiner

*Primary Examiner* — Nam D Pham
(74) *Attorney, Agent, or Firm* — Kilpatrick Townsend & Stockton LLP (57) ABSTRACT

A method, computer program product and a system for imaging an area that includes an upper surface and hole. The method may include acquiring, by a charged particle imager, a first image of a first type of electrons of the area while the charged particle imager is at a first configuration; acquiring, by the charged particle imager, a second image of the first type of electrons of the area and a first image of a second type of electrons of the area while the charged particle imager is at a second configuration that differs from the first configuration; and generating a hybrid image of the area based on (i) a first image of the first type of electrons of the upper surface, (ii) an inter-image offset, and (iii) a first image of the second type of electrons of the bottom of the hole.

21 Claims, 5 Drawing Sheets

IMAGING AN AREA THAT INCLUDES AN UPPER SURFACE AND A HOLE

BACKGROUND OF THE INVENTION

Integrated circuits are manufactured by a highly complex manufacturing process. The integrated circuits may be evaluated during the manufacturing process and even after a completion of the manufacturing process.

The evaluation of the integrated circuit may include inspecting the integrated circuit, reviewing the integrated circuit, and additionally or alternatively, measuring structural elements of the integrated circuit. Deep and narrow holes are hard to inspect—as electrons that impinge on the bottom of the hole and electrons that impinge on the sidewalls of the hole do not exit the hole.

There is a growing need to provide an efficient method for inspecting an area that includes an upper surface and a hole.

SUMMARY

There may be provided a method for imaging an area that includes an upper surface and hole. The method may include: (a) Acquiring, by a charged particle imager, a first image of a first type of electrons of the area while the charged particle imager is at a first configuration. The first image of the first type of electrons of the area may include a first image of the first type of electrons of the upper surface. (b) Acquiring, by the charged particle imager, a second image of the first type of electrons of the area and a first image of a second type of electrons of the area while the charged particle imager is at a second configuration that differs from the first configuration. The first image of the second type of electrons of the area may include a first image of the second type of electrons of a bottom of the hole. (c) Calculating, based on a comparison between the first image of the first type of electrons of the area and the second image of the first type of electrons of the area, an inter-image offset. (d) Generating a hybrid image of the area based on (i) the first image of the first type of electrons of the upper surface, (ii) the inter-image offset, and (iii) the first image of the second type of electrons of the bottom of the hole.

There may be provided a computer program product that stores instructions that once executed by a computerized system cause the computerized system to perform the steps of: (a) Acquiring, by a charged particle imager, a first image of a first type of electrons of the area while the charged particle imager is at a first configuration. The first image of the first type of electrons of the area may include a first image of the first type of electrons of the upper surface. (b) Acquiring, by the charged particle imager, a second image of the first type of electrons of the area and a first image of a second type of electrons of the area while the charged particle imager is at a second configuration that differs from the first configuration. The first image of the second type of electrons of the area may include a first image of the second type of electrons of a bottom of the hole. (c) Calculating, based on a comparison between the first image of the first type of electrons of the area and the second image of the first type of electrons of the area, an inter-image offset. (d) Generating a hybrid image of the area based on (i) the first image of the first type of electrons of the upper surface, (ii) the inter-image offset, and (iii) the first image of the second type of electrons of the bottom of the hole.

There may be provided a system for imaging an area that includes an upper surface and hole, the system may include a charged particle imager and a processor. The charged particle imager may be arranged and construed to (a) acquire a first image of a first type of electrons of the area while the charged particle imager is at a first configuration; wherein the first image of the first type of electrons of the area may include a first image of the first type of electrons of the upper surface; and (b) acquire a second image of the first type of electrons of the area and a first image of a second type of electrons of the area while the charged particle imager is at a second configuration that differs from the first configuration; wherein the first image of the second type of electrons of the area may include a first image of the second type of electrons of a bottom of the hole. The processor may be arranged and construed to (a) calculate, based on a comparison between the first image of the first type of electrons of the area and the second image of the first type of electrons of the area, an inter-image offset; and (b) generate a hybrid image of the area based on (i) the first image of the first type of electrons of the upper surface, (ii) the inter-image offset, and (iii) the first image of the second type of electrons of the bottom of the hole.

BRIEF DESCRIPTION OF THE DRAWINGS

The subject matter regarded as the invention is particularly pointed out and distinctly claimed in the concluding portion of the specification. The invention, however, both as to organization and method of step, together with substrates, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Any reference in the specification to a method should be applied mutatis mutandis to a system capable of executing the method and to a computer program product that stores instructions for executing the method.

Any reference in the specification to a system should be applied mutatis mutandis to a method that may be executed by the system and to a computer program product that stores instructions for executing the method.

Any reference in the specification to a computer program product should be applied mutatis mutandis to a method that is performed when executing instructions stored in the computer program product and to a system that is arranged and construed to execute the instructions stored in the computer program product. The computer program product is non-transitory and may include a non-transitory medium for storing instructions. Non-limiting examples of a computer program product are a memory chip, an integrated circuit, a disk, a magnetic memory unit, and a memresitor memory unit.

The assignment of the same reference numbers to various components may indicate that these components are similar to each other.

There may be provided a method for generating a hybrid image of an area that includes an upper surface and a hole. The hole has nanometric dimensions and has a high aspect ratio. An aspect ratio is the ratio between a depth of the hole and a width of the hole. A high aspect ratio may exceed ten. The hole is of nanometric dimensions in the sense that a width of the hole may be about few (for example—between 1 and 9) nanometer or few tens of nanometers.

The following example refers to an object. The object may be a semiconductor wafer, or any other object that has high aspect-ratio holes of nanometric dimensions.

The hybrid image may include (a) pixels that are taken of an image of the upper surface of the area, and (b) pixels that are taken from another image of the bottom of the hole. Pixels that are close to the border between the upper surface and the bottom of the hole may be modified in order to prevent sharp changes between pixels of the hybrid image. A smoothing function may be applied on selected pixels that are close to the border. Any smoothing function may be applied.

A pixel that is close to the border (or proximate to the border) may be located within a predefined number of pixels from the border, for example, may be located up to a distance that is smaller than a predefined fraction (for example, between 1 and 15 percent) from the width of the bottom of the hole.

One or more images of the area may be taken by a charged particle imager while in a first configuration. One or more images of the area may be taken by the charged particle imager while in a second configuration.

The one or more images taken in each one of the first and second configurations may include images of electrons of different types—for example backscattered electron images and/or secondary electron images, and/or other types of charged particle images.

The second configuration differs from the first configuration by at least one charged particle imager parameter. The at least one charged particle imager parameter may be a focus condition, a landing energy condition, a charging condition, an intensity condition, and the like.

For simplicity of explanation it is assumed that the second configuration differs from the first configuration by a location of the focal plane of the charged particle imager. For example, when in the first configuration the focal plane of the charged particle imager corresponds (substantially falls on) the upper surface. When in the second configuration the focal plane of the charged particle imager corresponds (substantially falls on) the bottom of the hole.

The phrase "substantially falls on" may include falls exactly on or may deviate by a non-substantially amount, for example, may deviate up to a predefined amount (for example up to 2-30 nanometers), or up to a predefined percent of the depth of the hole (for example, up to 5-30 percent of the depth of the hole).

It is assumed, for simplicity of explanation, that the one or more images acquired when the charged particle imager is at the first configuration include a first secondary electron image of the area. It is also assumed, for simplicity of explanation, that the one or more images acquired when the charged particle imager is at the second configuration include a second secondary electron image of the area and a first backscattered electron image of the area.

The first secondary electron image of the area and the second secondary electron image of the area are compared in order to find an inter-image offset. A hybrid image may be generated by (i) taking pixels of the first secondary electron image for representing the upper surface and (ii) taking pixels of the first backscattered electron image for representing the bottom of the hole. It should be noted that steps (i) and (ii) may include (or may be preceded by) compensating for the inter-image offset. The compensating may include shifting one or more images.

Figure 1:
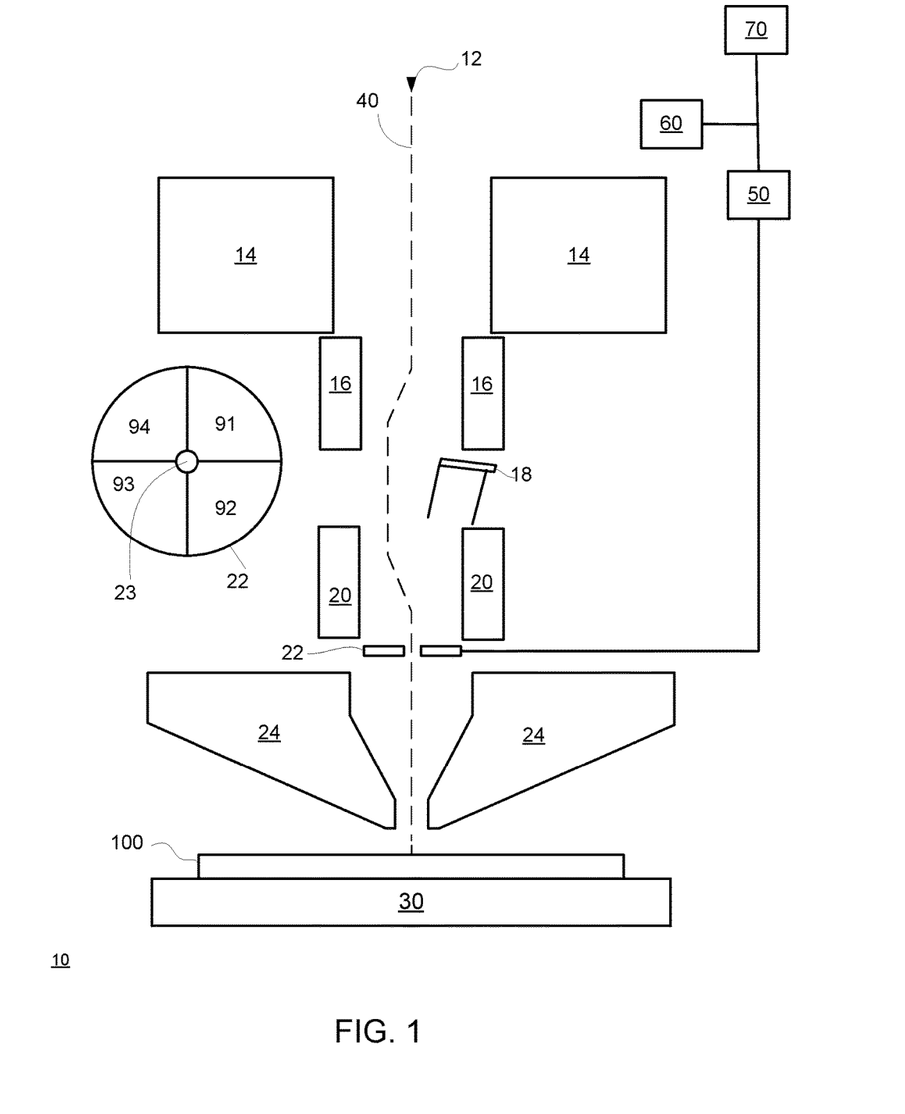
FIG. 1 is an example of an object and a charged particle imager.
Figure 2:
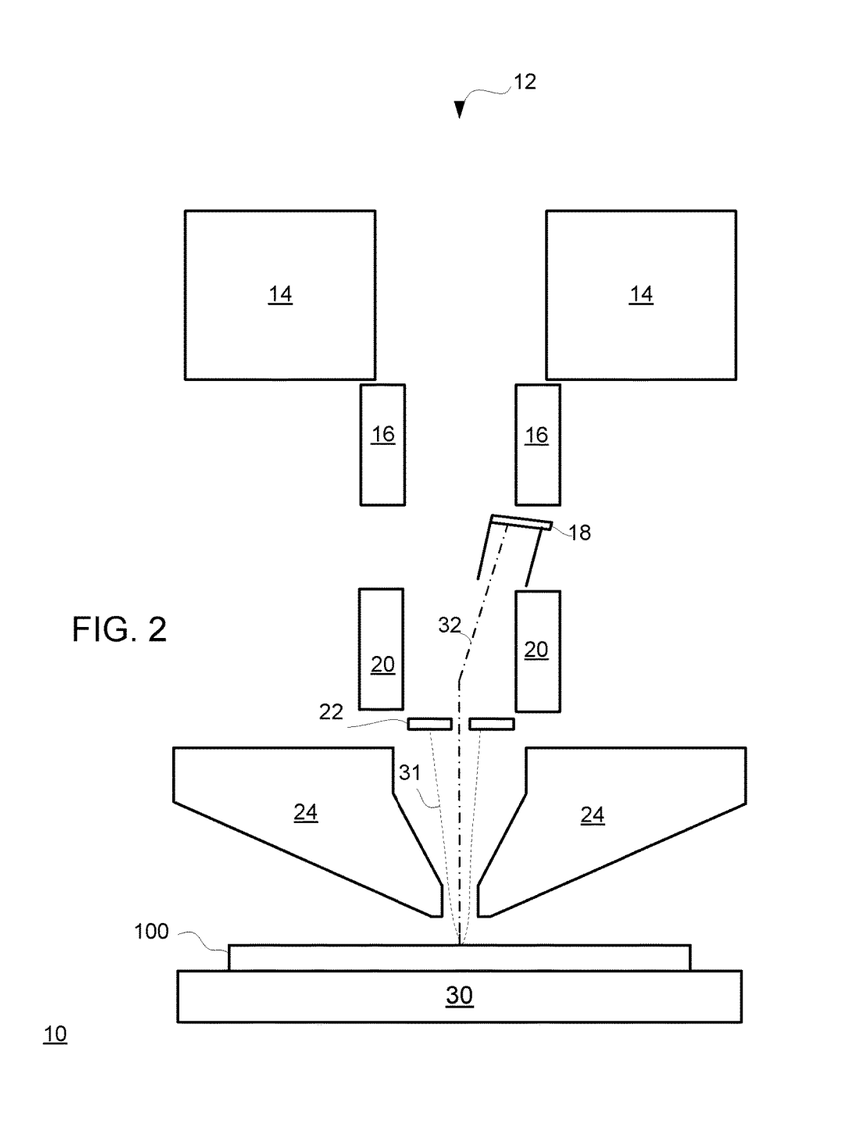
FIG. 2 is an example of object and a charged particle imager.

FIG. 1 and FIG. 2 illustrate object 100 and charged particle imager 10. Charged particle imager 10 includes stage 30, processor 50, memory unit 60, controller 70, and electron optics. The electron optics includes beam source 12, condenser lens 14, first deflector 16, backscattered electron sensor 18, second deflector 20, secondary electron detector 22, and objective lens 24.

Stage 30 is arranged to support object 100 and move object. Controller 70 may control the operation of the charged particle imager 10. Processor 50 may generate images from detection signals sent from backscattered electron sensor 18 and/or secondary electron detector 22. Processor 50 may be arranged and construed (for example by being programmed) to execute any step of any method illustrated in the specification. The phrase "configured to" and the phrase "arranged and construed" are used in an interchangeable manner. It should be noted that processor 50 may be located in a remote computer or any other computerized system that differs from the charged particle imager 10.

Beam source 12 generates a primary electron beam 40. FIG. 1 illustrates the primary electron beam 40 as being twice deflected by first deflector 16 and second deflector 20, as passing through objective lens 24 and impinges on object 100. The primary electron beam 40 may pass any other path. For example—the primary electron beam 40 may be deflected once or more than twice, and the primary electron beam 40 may propagate in any other manner.

Secondary electron detector 22 has four segments 91, 92, 93 and 94 that receive secondary electrons. Secondary electron detector 22 also as a center aperture 23 through which backscattered electrons may pass and reach backscattered electron sensor 18.

FIG. 2 illustrates secondary electrons 31 that impinge on secondary electron detector 22, and backscattered electrons 32 that pass through the center aperture and impinge on backscattered electron sensor 18. The backscattered electrons 32 are deflected towards the backscattered electron sensor 18 by second deflector 20. An in-lens detector is a detector that is located inside a column of a charged particle imager. An out-of-lens detector is a detector that is located outside a column of a charged particle imager.

FIG. 2 illustrates secondary electron detector 22, and backscattered electrons 32 as being in-lens detectors. This is merely an example. It should be noted that the electron optics of charged particle imager 10 may differ from the electron optics of FIGS. 1 and 2. For example—the secondary electron detector may be any out-of-lens secondary electron detector, the secondary electron detector may be any in-lens secondary electron detector, the secondary electron detector may include fewer than four segments, the secondary electron detector may have more than four segments, the backscattered electron detector may be any out-of-lens backscattered electron detector, the backscattered electron detector may be any in-lens backscattered electron detector, the types of detectors may differ from a secondary electron detector and a backscattered electron detector, there may be any number of deflectors, the primary electron beam may be normal to the object or not normal to the object, and the like.

Figure 3:
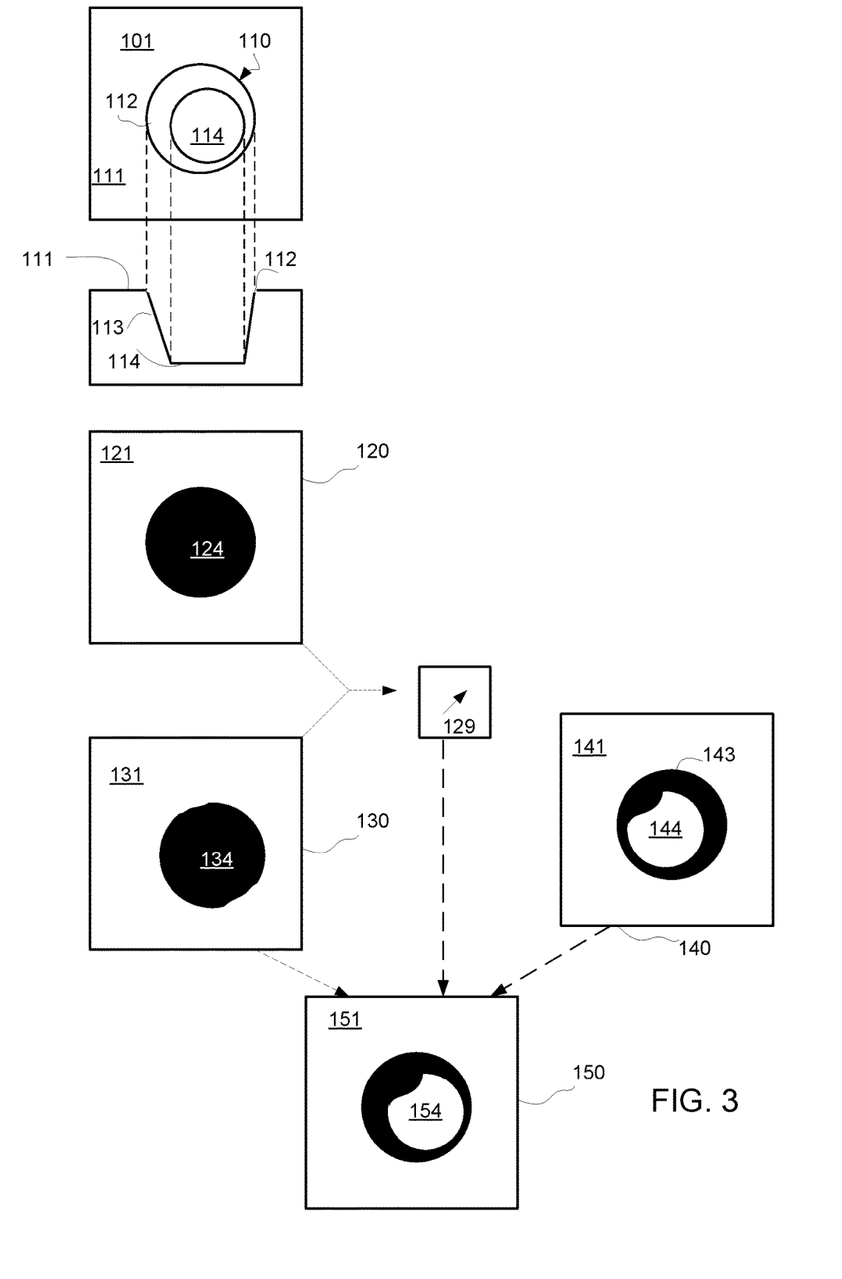
FIG. 3 is an example of an area and various images.

FIG. 3 is an example of:
a. A cross sectional view of an area 101 that includes upper surface 111 and a hole 110. The hole 110 includes bottom 114, sloped sidewalls 113, and an upper surface 112.
b. A top view of the area.
c. A first secondary electron image 120 of the area (acquired when the focal plane corresponds to the upper surface) that includes a first secondary electron image 121 of the upper surface, and a first secondary electron image 124 of the hole. The first secondary electron image of the hole usually does not include any information as secondary electrons from the hole do not reach the electron optics.
d. A second secondary electron image 130 of the area (acquired when the focal plane corresponds to the bottom of the hole), that includes a second secondary electron image 131 of the upper surface, and a second secondary electron image 134 of the hole. The second secondary electron image of the hole usually does not include any information as secondary electrons from the hole do not reach the electron optics. The second secondary electron image 130 is defocused.
e. A first backscattered electron image 140 of the area (acquired when the focal plane corresponds to the bottom of the hole) that includes a first backscattered electron image 141 of the upper surface, and a first backscattered image of the hole. The first backscattered electron image 140 of the area also includes a first backscattered electron image 143 of the sidewalls of the hole and a first backscattered electron image 144 of the bottom of the hole. The first backscattered electron image 144 of the bottom of the hole includes information about the bottom of the hole.
f. An inter-image offset 129.
g. A hybrid image 150 that includes pixels 151 of the upper surface and pixels 154 of the bottom of the hole.

The hole of FIG. 3 is a rounded hole—and the inter-image offset 129 may be calculated by trying to find the offset that provided the best correlation between the first secondary electron image of the area and the second secondary electron image of the area. It should be noted that smoothing operations may be applied on selected pixels near the boundary between the upper surface and the bottom of the hole.

Figure 4:
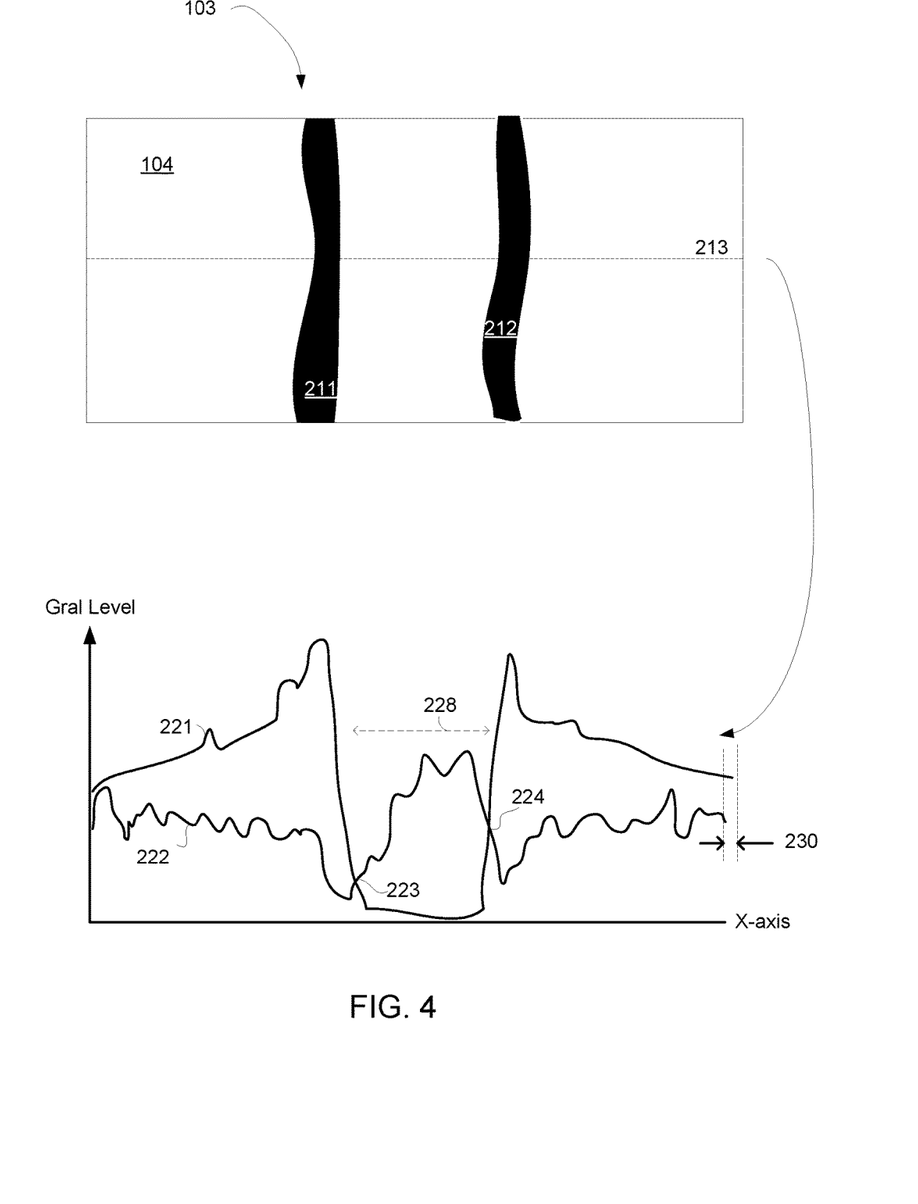
FIG. 4 is an example of an area and various images.

FIG. 4 is an example of:
a. A top view of an area 103 that includes upper surface 104 and two vertical trenches 211 and 212, and upper surface 104.
b. A distribution 221 of grey levels of pixels of a second secondary electron image of the area, the pixels are taken along imaginary line 213.
c. A distribution 222 of grey levels of pixels of a first backscattered electron image of the area, the pixels are taken along imaginary line 213.

At least one of distributions 221 and 222 is inter-image offset compensated. The inter-image offset is denoted 230. Distributions 221 and 222 cross each other at right crossing point 224 and left crossing point 223. The area between right crossing point 224 and left crossing point 223 is referred to intermediate region 228.

A hybrid image may be generated by selecting pixels from distribution 221 to the right of intermediate region 228, selecting pixels from distribution 222 at the intermediate region 228, and selecting pixels from distribution 221 to the left of intermediate region 228. Selected pixels that are proximate to the right crossing point 224 and the left crossing point 223 may undergo a smoothing operation.

FIG. 4 illustrates distributions of pixels taken along a single imaginary line 213. Different distributions may be taken along multiple imaginary lines (multiple stripes) and the hybrid image may be generated using the process mentioned above when applied on multiple distributions acquired over the multiple stripes.

Figure 5:
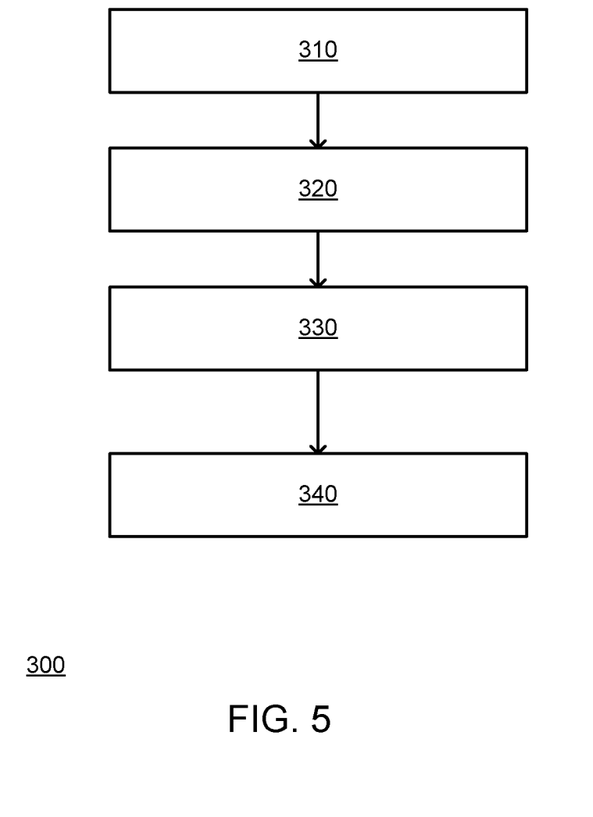
FIG. 5 is an example of a method.

FIG. 5 illustrates an example of method 300. Method 300 may include a sequence of steps 310, 320, 330 and 340. Step 310 may include acquiring, by a charged particle imager, a first image of a first type of electrons of the area while the charged particle imager is at a first configuration. The first image of the first type of electrons of the area may include a first image of the first type of electrons of the upper surface.

Step 320 may include acquiring, by the charged particle imager, a second image of the first type of electrons of the area and a first image of a second type of electrons of the area while the charged particle imager is at a second configuration. The second configuration differs from the first configuration. The first image of the second type of electrons of the area may include a first image of the second type of electrons of a bottom of the hole.

Step 330 may include calculating an inter image offset, based on a comparison between the first image of the first type of electrons of the area and the second image of the first type of electrons of the area. Step 330 may include comparing between the first image of the first type of electrons of the area and the second image of the first type of electrons of the area to find the inter image offset.

Step 340 may include generating a hybrid image of the area based on (i) the first image of the first type of electrons of the upper surface, (ii) the inter-image offset, and (iii) the first image of the second type of electrons of the bottom of the hole. The first image of the first type of electrons of the area may be a first secondary electron image of the area. The first image of the first type of electrons of the upper surface may be a first secondary electron image of the upper surface. The second image of the first type of electrons of the area may be a second secondary electron image of the area. The first image of the second type of electrons of the area may be a first backscattered electron image of the area. The first image of the second type of electrons of the bottom of the hole may be a first backscattered electron image of the bottom of the hole. The second configuration may differ from the first configuration by a position of a focal plane of the charged particle imager.

While the charged particle imager is at the first configuration, a focal plane of the charged particle imager may correspond to the upper surface. While the charged particle imager is at the second configuration, the focal plane of the charged particle imager may correspond to the bottom of the hole. The hole may be a trench.

Step 330 may include searching for a latitudinal displacement between pixels of the hole at the first secondary electron image of the area and between corresponding pixels of the hole at the second secondary electron image of the area. The hole may be a circular contact. Step 330 may include correlating between pixels of the circular contact at the first secondary electron image of the area and pixels of the circular contact at the second secondary electron image of the area.

Step 340 may include:

a. Compensating for the inter-image offset to provide an inter-image compensated first backscattered electron image of the bottom of the hole.

b. Finding crossing points between (i) gray levels of pixels of the first secondary image of the upper surface, and (ii) gray levels of pixels of the inter-image compensated first backscattered electron image of the bottom of the hole.

c. Selecting, for the hybrid image, in an intermediate region defined between the crossing points, at least a majority of the pixels of the inter-image compensated first backscattered electron image of the bottom of the hole.

d. Selecting, for the hybrid image, outside the intermediate region, at least a majority of the pixels of the first secondary electron image of the upper surface.

The method may include applying a smoothing function on pixels that are proximate to the crossing points. The at least a majority of the pixels may include pixels, above 50% of the pixels, or any percentage between 51 and 99 percent of the pixels.

The hole may be a trench and step 340 may include:

a. Compensating for the inter-image offset to provide an inter-image compensated first secondary image of the upper surface.

b. Finding crossing points between (i) gray levels of pixels of the inter-image compensated first secondary image of the upper surface, and (ii) gray levels of pixels of the first backscattered electron image of the bottom of the hole.

c. Selecting, for the hybrid image, in an intermediate region defined between the crossing points, at least a majority of the pixels of the first backscattered electron image.

d. Selecting, for the hybrid image, outside the intermediate region, at least a majority of the pixels of the inter-image compensated first secondary electron image of the upper surface.

The method may include applying a smoothing function on pixels that are proximate to the crossing points. It should be noted that there may be provided a method that may include:

a. Acquiring, by a charged particle imager, while the charged particle imager is at a first configuration, first images of a multiple types of electrons of the area;

b. Acquiring, by a charged particle imager, while the charged particle imager is at a second configuration, second images of a multiple types of electrons of the area;

c. Using first and second images of a certain type of electrons of the area for registration (finding the intra-image offset).

d. Using first and second images of another type of electrons of the area for generating the hybrid image— while taking into account the intra-image offset.

Step (c) may include (or may be preceded by) selecting the certain type of electrons. The selection may be based on one or more parameters of the images such as the smoothness of images of the different types of images. Smoother images can provide a more accurate registration. Other parameters may include a signal to noise ratio, and the like.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of step in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple may be combined into a single step, a single step may be distributed in additional steps and steps may be executed at least partially overlapping in time. Moreover, alternative embodiments may include multiple instances of a particular step, and the order of steps may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for imaging an area that includes an upper surface and hole, the method comprises:
    acquiring, by a charged particle imager, a first image of a first type of electrons of the area while the charged particle imager is at a first configuration; wherein the first image of the first type of electrons of the area comprises a first image of the first type of electrons of the upper surface;
    acquiring, by the charged particle imager, a second image of the first type of electrons of the area and a first image of a second type of electrons of the area while the charged particle imager is at a second configuration that differs from the first configuration; wherein the first image of the second type of electrons of the area comprises a first image of the second type of electrons of a bottom of the hole;
    calculating, based on a comparison between the first image of the first type of electrons of the area and the second image of the first type of electrons of the area, an inter-image offset; and
    generating a hybrid image of the area based on (i) the first image of the first type of electrons of the upper surface, (ii) the inter-image offset, and (iii) the first image of the second type of electrons of the bottom of the hole.

2. The method according to claim 1 wherein the first image of the first type of electrons of the area is a first secondary electron image of the area; wherein the first image of the first type of electrons of the upper surface is a first secondary electron image of the upper surface; wherein the second image of the first type of electrons of the area is a second secondary electron image of the area; wherein the first image of the second type of electrons of the area is a first backscattered electron image of the area; and wherein the first image of the second type of electrons of the bottom of the hole is a first backscattered electron image of the bottom of the hole.

3. The method according to claim 2 wherein the second configuration differs from the first configuration by a position of a focal plane of the charged particle imager.

4. The method according to claim 2 wherein while the charged particle imager is at the first configuration, a focal plane of the charged particle imager corresponds to the upper surface; and wherein while the charged particle imager is at the second configuration, the focal plane of the charged particle imager corresponds to the bottom of the hole.

5. The method according to claim 4 wherein the hole is a trench; and wherein the calculating of the inter-image offset comprises searching for a latitudinal displacement between pixels of the hole at the first secondary electron image of the area and between corresponding pixels of the hole at the second secondary electron image of the area.

6. The method according to claim 4 wherein the hole is a circular contact; and wherein the calculating of the inter-image offset comprises correlating between pixels of the circular contact at the first secondary electron image of the area and pixels of the circular contact at the second secondary electron image of the area.

7. The method according to claim 4 wherein the generating of the hybrid image of the area comprises:
    a) compensating for the inter-image offset to provide an inter-image compensated first backscattered electron image of the bottom of the hole;
    b) finding crossing points between (i) gray levels of pixels of the first secondary image of the upper surface, and (ii) gray levels of pixels of the inter-image compensated first backscattered electron image of the bottom of the hole;
    c) selecting, for the hybrid image, in an intermediate region defined between the crossing points, at least a majority of the pixels of the inter-image compensated first backscattered electron image of the bottom of the hole, and
    d) selecting, for the hybrid image, outside the intermediate region, at least a majority of the pixels of the first secondary electron image of the upper surface.

8. The method according to claim 7 comprising applying a smoothing function on selected pixels that are proximate to the crossing points.

9. The method according to claim 4 wherein the hole is a trench and wherein the generating of the hybrid image of the area comprises:
    a) compensating for the inter-image offset to provide an inter-image compensated first secondary image of the upper surface;
    b) finding crossing points between (i) gray levels of pixels of the inter-image compensated first secondary image of the upper surface, and (ii) gray levels of pixels of the first backscattered electron image of the bottom of the hole;
    c) selecting, for the hybrid image, in an intermediate region defined between the crossing points, at least a majority of the pixels of the first backscattered electron image, and
    d) selecting, for the hybrid image, outside the intermediate region, at least a majority of the pixels of the inter-image compensated first secondary electron image of the upper surface.

10. The method according to claim 9 comprising applying a smoothing function on selected pixels that are proximate to the crossing points.

11. A computer program product that stores instructions that once executed by a computerized system cause the computerized system to perform the steps of:
acquiring, by a charged particle imager, a first image of a first type of electrons of an area while the charged particle imager is at a first configuration; wherein the first image of the first type of electrons of the area comprises a first image of the first type of electrons of an upper surface of the area;
acquiring, by the charged particle imager, a second image of the first type of electrons of the area and a first image of a second type of electrons of the area while the charged particle imager is at a second configuration that differs from the first configuration; wherein the first image of the second type of electrons of the area comprises a first image of the second type of electrons of a bottom of a hole of the area;
calculating, based on a comparison between the first image of the first type of electrons of the area and the second image of the first type of electrons of the area, an inter-image offset; and
generating a hybrid image of the area based on (i) the first image of the first type of electrons of the upper surface, (ii) the inter-image offset, and (iii) the first image of the second type of electrons of the bottom of the hole.

12. The computer program product according to claim 11 wherein the first image of the first type of electrons of the area is a first secondary electron image of the area; wherein the first image of the first type of electrons of the upper surface is a first secondary electron image of the upper surface; wherein the second image of the first type of electrons of the area is a second secondary electron image of the area; wherein the first image of the second type of electrons of the area is a first backscattered electron image of the area; and wherein the first image of the second type of electrons of the bottom of the hole is a first backscattered electron image of the bottom of the hole.

13. The computer program product according to claim 12 wherein the second configuration differs from the first configuration by a position of a focal plane of the charged particle imager.

14. The computer program product according to claim 12 wherein while the charged particle imager is at the first configuration, a focal plane of the charged particle imager corresponds to the upper surface; and wherein while the charged particle imager is at the second configuration, the focal plane of the charged particle imager corresponds to the bottom of the hole.

15. The computer program product according to claim 14 wherein the calculating of the inter-image offset comprises searching for a latitudinal displacement between pixels of a trench at the first secondary electron image of the area and between corresponding pixels of the trench at the second secondary electron image of the area.

16. The computer program product according to claim 14 wherein the calculating of the inter-image offset comprises correlating between pixels of a circular contact at the first secondary electron image and pixels of the circular contact at the second secondary electron image.

17. The computer program product according to claim 14 wherein the generating of the hybrid image of the area comprises:

a) compensating for the inter-image offset to provide an inter-image compensated first backscattered electron image of the bottom of the hole;
b) finding crossing points between (i) gray levels of pixels of the first secondary image of the upper surface, and (ii) gray levels of pixels of the inter-image compensated first backscattered electron image of the bottom of the hole;
c) selecting, for the hybrid image, in an intermediate region defined between the crossing points, at least a majority of the pixels of the inter-image compensated first backscattered electron image of the bottom of the hole, and
d) selecting, for the hybrid image, outside the intermediate region, at least a majority of the pixels of the first secondary electron image of the upper surface.

18. The computer program product according to claim 17 wherein the instructions, when executed by the computerized system, further cause the computerized system to apply a smoothing function on selected pixels that are proximate to the crossing points.

19. The computer program product according to claim 14 wherein the hole is a trench and wherein the generating of the hybrid image of the area comprises:

a) compensating for the inter-image offset to provide an inter-image compensated first secondary image of the upper surface;
b) finding crossing points between (i) gray levels of pixels of gray levels of pixels of the first backscattered electron image of the bottom of the hole;
c) selecting, for the hybrid image, in an intermediate region defined between the crossing points, at least a majority of the pixels of the first backscattered electron image, and
d) selecting, for the hybrid image, outside the intermediate region, at least a majority of the pixels of the inter-image compensated first secondary electron image of the upper surface.

20. The computer program product according to claim 19 wherein the instructions, when executed by the computerized system, further cause the computerized system to apply a smoothing function on selected pixels that are proximate to the crossing points.

21. A system for imaging an area that includes an upper surface and hole, the system comprising:
a charged particle imager and a processor;
wherein the charged particle imager is arranged and construed to (a) acquire a first image of a first type of electrons of the area while the charged particle imager is at a first configuration; wherein the first image of the first type of electrons of the area comprises a first image of the first type of electrons of the upper surface; and (b) acquire a second image of the first type of electrons of the area and a first image of a second type of electrons of the area while the charged particle imager is at a second configuration that differs from the first configuration; wherein the first image of the second type of electrons of the area comprises a first image of the second type of electrons of a bottom of the hole;
wherein the processor is arranged and construed to (a) calculate, based on a comparison between the first image of the first type of electrons of the area and the second image of the first type of electrons of the area, an inter-image offset; and (b) generate a hybrid image of the area based on (i) the first image of the first type of electrons of the upper surface, (ii) the inter-image offset, and (iii) the first image of the second type of electrons of the bottom of the hole.

* * * * *

UNITED STATES PATENT AND TRADEMARK OFFICE
CERTIFICATE OF CORRECTION

| | | |
|---|---|---|
| PATENT NO. | : 10,340,116 B1 | Page 1 of 1 |
| APPLICATION NO. | : 16/007580 | |
| DATED | : July 2, 2019 | |
| INVENTOR(S) | : Ran Schleyen, Vladislav Kaplan and Shachar Paz | |

It is certified that error appears in the above-identified patent and that said Letters Patent is hereby corrected as shown below:

In the Specification

Column 1, Line 4, please add the following new heading and paragraph before the heading BACKGROUND:
--STATEMENT AS TO RIGHTS TO INVENTIONS MADE UNDER FEDERALLY SPONSORED RESEARCH AND DEVELOPMENT
The project leading to this application has received funding from the ECSEL Joint Undertaking (JU) under grant agreement No. 737479 (TAKEMI5). The JU receives support from the European Union's Horizon 2020 research and innovation programme and Italy, Germany, Belgium, Sweden, Austria, Romania, Slovakia, France, Poland, Spain, Ireland, Switzerland, Israel.--

Signed and Sealed this
Twenty-first Day of November, 2023

Katherine Kelly Vidal
*Director of the United States Patent and Trademark Office*